United States Patent
Krautbauer et al.

(10) Patent No.: US 7,341,787 B2
(45) Date of Patent: Mar. 11, 2008

(54) PROCESS FOR PRODUCING HIGHLY DOPED SEMICONDUCTOR WAFERS, AND DISLOCATION-FREE HIGHLY DOPED SEMICONDUCTOR WAFERS

(75) Inventors: Rupert Krautbauer, Mühldorf (DE); Erich Gmeilbauer, Pantaleon (AT); Robert Vorbuchner, Burghausen (DE); Martin Weber, Kastl (DE)

(73) Assignee: Siltronic AG, Munich (DE)

( * ) Notice: Subject to any disclaimer, the term of this patent is extended or adjusted under 35 U.S.C. 154(b) by 157 days.

(21) Appl. No.: 11/043,574

(22) Filed: Jan. 26, 2005

(65) Prior Publication Data
US 2005/0167001 A1 Aug. 4, 2005

(30) Foreign Application Priority Data
Jan. 29, 2004 (DE) .................. 10 2004 004 555

(51) Int. Cl.
C30B 15/00 (2006.01)
B32B 3/02 (2006.01)
B32B 9/04 (2006.01)
H01L 21/00 (2006.01)

(52) U.S. Cl. .................. 428/446; 117/13; 117/19; 117/928; 428/64.1; 438/45; 438/491; 438/495; 438/914

(58) Field of Classification Search .................. 117/13, 117/19, 928; 428/64.1; 438/45, 491, 495, 438/914
See application file for complete search history.

(56) References Cited

U.S. PATENT DOCUMENTS 3,812,519 A * 5/1974 Nakamura et al. .......... 257/607
5,130,261 A * 7/1992 Usuki et al. .................. 438/530
5,553,566 A 9/1996 Chiou et al.
5,700,320 A 12/1997 Izunome et al.
6,013,129 A 1/2000 Yoshida
6,059,815 A 5/2000 Lee
2003/0104222 A1* 6/2003 Ono et al. .................. 428/446
2004/0009111 A1* 1/2004 Haga et al. .............. 423/328.2

FOREIGN PATENT DOCUMENTS

DE 199 61 126 A1 6/2001
DE 101 06 369 A1 11/2001

(Continued)

OTHER PUBLICATIONS

Quick Reference Manual for Silicon Integrated Circuit Technology; W.E. Beadle, J.C.C. Tsai & R.D. Plummer, John Wiley & Sons, New York, Chichester, Brisbane; pp. 2-70; 1985.

(Continued)

*Primary Examiner*—Callie Shosho
*Assistant Examiner*—Jonathan Langman
(74) *Attorney, Agent, or Firm*—Brooks Kushman P.C.

(57) ABSTRACT

The invention relates to a process for producing highly doped semiconductor wafers, in which at least two dopants which are electrically active and belong to the same group of the periodic system of the elements are used for the doping. The invention also relates to a semiconductor wafer which is free of dislocations and is doped with at least two electrically active dopants which belong to the same group of the periodic system of the elements.

8 Claims, 1 Drawing Sheet

FOREIGN PATENT DOCUMENTS

| | | |
|---|---|---|
| DE | 102 07 284 A1 | 9/2003 |
| DE | 102 50 822 A1 | 5/2004 |
| EP | 0417 737 B1 | 11/1995 |
| JP | 60-045016 | 3/1985 |
| JP | 08-259373 | 10/1996 |
| JP | 2002-104897 | 4/2002 |
| JP | 2002-208596 | 7/2002 |
| JP | 2003-124219 | 4/2003 |
| KR | 0084108 | 10/1994 |
| WO | WO 02/24986 A2 | 3/2002 |

OTHER PUBLICATIONS

DE 10250822, English Abstract.
DE 10106369, English Abstract.
DE 10207284, English Abstract.
DE 19961126, English Abstract.
Patent Abstract of Japan corresponding to JP 2002-208596.
Patent Abstract of Japan corresponding to JP 60-045016.
Patent Abstract of Japan corresponding to JP 2002-104897.

* cited by examiner

PROCESS FOR PRODUCING HIGHLY DOPED SEMICONDUCTOR WAFERS, AND DISLOCATION-FREE HIGHLY DOPED SEMICONDUCTOR WAFERS

BACKGROUND OF THE INVENTION

1. Field of the Invention

The invention relates to a process for producing highly doped semiconductor wafers, in which at least two dopants are used. The invention also relates to dislocation-free, highly doped semiconductor wafers.

2. Background Art

Highly doped semiconductor substrates with a low resistivity are needed, for example, for the fabrication of power components. In conventional processes, in each case, only one specific element is incorporated as a dopant in the semiconductor wafers in order to reduce the substrate resistance, for example, B, P, As, or Sb in silicon. Typical dopant concentrations for highly doped silicon are greater than $10^{18}/cm^3$, and are usually achieved by adding the dopant to the melt before or during crystal growth or through diffusion of the dopant into the semiconductor wafers which have been processed from the single crystal that has been grown.

The diffusion constant of the dopant in the semiconductor material is highly important. Since the deposition of epitaxial layers and the processing of semiconductor wafers are usually carried out at high temperatures, dopant can diffuse from the substrate into the epitaxial layer. When dopants with a high diffusion constant are used, therefore, the transition range between substrate and epitaxial layer is wider than when dopants with a low diffusion coefficient are used. The result is that when using dopants with high diffusion coefficients, thicker epitaxial layers are required, up until complete transition of the materials properties. In industrial fabrication of semiconductor elements this leads to higher production costs. A further drawback of dopants with high diffusion coefficients results from the phenomenon known as auto-doping during the deposition of epitaxial layers. In this phenomenon, the dopant passes out of the substrate via the gas phase into the epitaxial layer and unintentionally alters the resistivity thereof. Therefore, it is preferable to use dopants which have a low diffusion coefficient in the semiconductor material.

However, the use of large quantities of dopant in the production of single crystals has various associated problems which restrict the minimum substrate resistances that can be achieved: high dopant concentrations in the melt can lead to precipitations of the dopant in the melt and to constitutional supercooling, which in both cases prevents single-crystalline growth. Moreover, large quantities of individual dopants may evaporate out of the melt, which increases the quantity of dopant required and can lead to the undesirable formation of toxic chemical compounds. A further problem with high dopant concentrations is that above certain concentrations some of the dopant atoms incorporated in the semiconductor material may be electrically inactive. This occurs, for example, if silicon is so strongly doped with arsenic that the resistivity drops below approximately 5 mOhm·cm (Quick Reference Manual for Silicon Integrated Circuit Technology; W. E. Beadle, J. C. C. Tsai & R. D. Plummer; John Wiley & Sons, New York, Chichester, Brisbane; pp. 2-70, 1985). On account of the abovementioned effects, dislocation-free crystal growth is only possible down to a certain minimum resistance, with the dopant limit concentration being determined by the procedure used in crystal growth and by the type of dopant.

SUMMARY OF THE INVENTION

The present invention provides a process which makes available dislocation-free semiconductor wafers whose resistivity has decreased to values which were not hitherto possible to reach with just one defined dopant. The present invention also provides a process which makes it possible to produce dislocation-free semiconductor wafers of a defined doping (n-type or p-type) and with improved properties, and/or which simplifies the production of dislocation-free semiconductor wafers with low resistivity.

These and other objects are met by a process for producing highly doped semiconductor wafers, in which at least two dopants are used for the doping, wherein the dopants are electrically active and belong to the same group of the periodic system of the elements, and by semiconductor wafers free of dislocations and doped with at least two dopants, wherein the dopants are electrically active and belong to the same group of the periodic system of the elements.

DETAILED DESCRIPTION OF THE PREFERRED EMBODIMENT(S)

Figure 1:
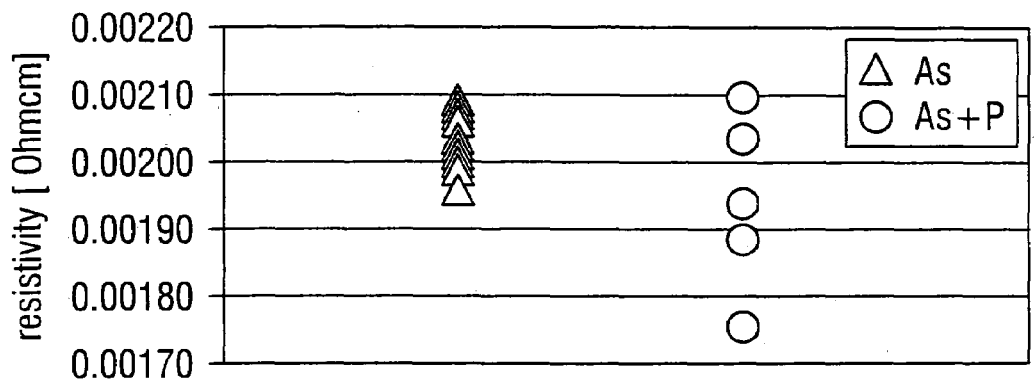
FIG. 1 uses an example to demonstrate that by doping with two dopants of the same type it is possible to produce dislocation-free semiconductor wafers with a lower resistivity than by doping with just one of the two dopants.

The semiconductor wafer preferably consists of silicon or germanium or a mixture of silicon and germanium and has a resistivity of 0.0005-0.1 Ohm·cm, more preferably 0.0005-0.005 Ohm·cm, and most preferably of 0.0005-0.002 Ohm·cm.

The use of a suitable combination of dopants of the same type in accordance with the present invention makes it possible to produce semiconductor substrates with improved materials properties under simplified process conditions. In the present context, dopants are considered to be of the same type if they belong to the same group of the periodic system of the elements. Although the prior art has described processes in which doping is likewise carried out using at least two different dopants, these processes differ fundamentally from the present invention in that they are in part aimed at achieving different effects and that there is no mention of doping with two electrically active dopants from the same group of the periodic system of the elements. In the context of the present invention, the term "electrically active dopant" denotes a dopant which, on account of its electron configuration, has a number of free electrons which differs from that of the semiconductor material. Co-doping of phosphorus-doped silicon with germanium as a second dopant, as described, for example, in U.S. Pat. No. 5,553,566 is not within the scope of the invention, since germanium is to be regarded as electrically neutral compared to silicon.

Although U.S. Pat. No. 6,013,129 describes the production of highly doped silicon with a combination of two dopants with a view to achieving as high a conductivity as possible ("metallic silicon"), in this process the total number of charge carriers, i.e. holes and electrons, is maximized by in each case combining a dopant from the group III elements (p-type, acceptors B, Al. Ga) with a dopant belonging to the group V elements (n-type electrical donors P. As. Sb) while, moreover, ensuring that one element is higher than silicon and one element is lower than silicon. One drawback of this process is that the different types of dopant mean that the charge carriers are partially compensated for and therefore particularly large quantities of dopant are required to allow highly doped semiconductor wafers to be produced. This process is altogether unsuitable for the production of pure n-type or p-type substrates.

According to the present invention, two dopants of the same type are used for doping. Accordingly, a significantly smaller quantity of each dopant is required than would be the case if the same resistivity had to be established using just one dopant. A further advantage is that the lower concentration of individual dopants means that less dopant of each type escapes from the melt during production of the single crystal. In addition, the smaller quantity of each individual dopant also reduces the electrically inactive proportion of each dopant. Consequently, the total quantity of dopants required can be reduced yet further, which leads to reduced production costs. Suitable selection of dopant quantities allows the concentration of the individual dopants to be reduced to such an extent that there is no constitutional supercooling of the melt, and dislocation-free growth of single crystals with higher levels of doping, using otherwise identical conditions, becomes possible.

The appropriate choice of the dopants and dopant quantities also allows sharper transition profiles to be achieved between the substrate and an epitaxial layer deposited thereon. On account of different diffusion coefficients, the respective transition profiles between epitaxial layers and substrate have different widths depending on the level of doping and the particular dopant. A suitable combination of dopants allows the width of the transition profile to be reduced for the same degree of doping (i.e. substrate resistance), making it possible to use thinner layers and therefore to achieve cost savings in the production process.

The production of the semiconductor wafers encompasses the steps with which the person skilled in the art is familiar, starting with the growth of a single crystal, for example by pulling the single crystal from a melt using the Czochralski method or crystallization of a single crystal by the float zone method. The melt preferably comprises silicon, germanium, or a mixture of these two semiconductor materials. The dopants are preferably added to the melt rather than being introduced through diffusion into semiconductor wafers that have been processed from the single crystal. The semiconductor wafers which have been processed from the multiple-doped single crystal are subjected to at least one of the (likewise standard) shaping measures, such as lapping, grinding, and polishing, and are preferably provided with at least one epitaxial layer on a main face, the resistivity of which generally differs from that of the highly doped substrate wafer. It is also preferable for a structure made up of electronic components to be applied to a main face of the substrate wafer or to the epitaxial layer.

The dopants for p-type doping preferably belong to group III of the periodic system of the elements, and the dopants for n-type doping preferably belong to group V of the periodic system of the elements. It is particularly preferable to use a combination of dopants which comprises the elements P and Sb, the elements As and Sb, the elements P and As, the elements Sb and N, the elements As and N or the elements P and N.

The concentration of the dopants is preferably greater than $1 \cdot 10^{18}$ cm$^{-3}$ in the case where the elements B, P or As are present, and is preferably greater than $1 \cdot 10^{17}$ cm$^{-3}$ in the case of Sb. It is particularly preferable for a concentration of the dopants to be greater than $1 \cdot 10^{19}$ cm$^{-3}$ in the case where the elements B, P or As are present and greater than $1 \cdot 10^{18}$ cm$^{-3}$ in the case of Sb. It is also particularly preferable to use a combination of dopants, such that the sum of all the dopant concentrations is greater than $3 \cdot 10^{19}$ cm$^{-3}$.

n-Type doping in which one of the dopants is antimony and the semiconductor wafer has a resistivity of 0.005 Ohm·cm or below is particularly preferred. n-type doping in which one of the dopants is arsenic and the semiconductor wafer has a resistivity of 0.002 Ohm·cm or below is also preferred. p-type doping in which the semiconductor wafer has a resistivity of 0.05 Ohm·cm or below is also particularly preferred.

Example (FIG. 1)

A dislocation-free, highly doped semiconductor wafer with a diameter of more than 150 mm and arsenic as dopant is only achievable down to a resistivity of approximately 0.002 Ohm·cm. At higher arsenic concentrations, dislocations are formed during the production of a single crystal using the conventional Czochralski process. By contrast, significantly lower resistivities can be achieved even without the formation of dislocations if co-doping with arsenic and phosphorus is used.

Figure 2:
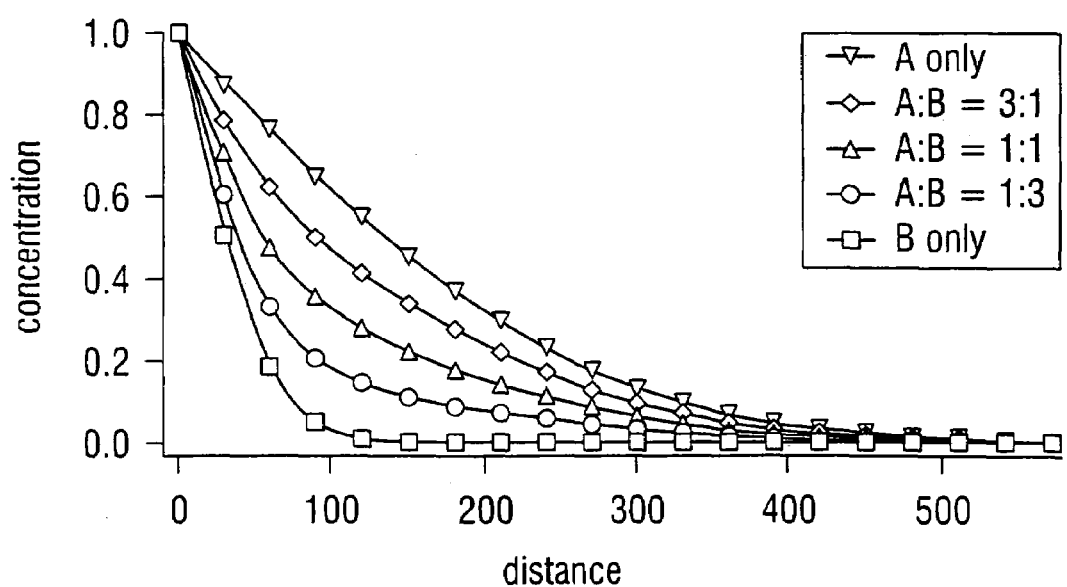
FIG. 2 shows the concentration profiles of the doping atoms at the transition from a highly doped substrate to an undoped epitaxially deposited layer for various combinations of two dopants A and B with different diffusion coefficients, in each case at the same level of doping (sum of the concentration of the two dopants).

FIG. 2 shows the concentration profiles of the doping atoms at the transition from a highly doped substrate to an undoped, epitaxially deposited layer for various combinations of two dopants A and B with different diffusion coefficients, in each case at the same level of doping (with the zero point at the interface and standardized concentrations). However, for the range of maximum levels of doping which can be achieved using known processes, the transition profiles are wider, since the occurrence of electrically inactive dopant complexes means that a larger quantity of an individual dopant is required. The co-doping with a further electrically active element in accordance with the invention reduces the sum of the dopant concentrations which is required to achieve a certain resistance. At the same time, the total quantity of dopant which diffuses out is reduced and a sharper transition profile becomes possible.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A highly doped n-type semiconductor wafer wherein the semiconductor wafer comprises silicon, or germanium or a mixture of silicon or germanium which is free of dislocations and is doped with P and As throughout the wafer such that the sum of alll dopant concentrations is greater than $3 \times 10^{19}$ atoms/cm$^3$, and wherein the dopants are incorporated into a single crystal silicon ingot from a melt of dopant-containing silicon, the highly doped semiconductor wafer processed from said ingot.

2. The semiconductor wafer of claim 1, which has at least one epitaxial layer deposited on a main face of the semiconductor wafer.

3. The semiconductor wafer of claim 1, which consists of silicon or germanium or a mixture of silicon or germanium and wherein the dopants are incorporated into a single crystal ingot during growth by the CZ method, from which wafers containing said at least two dopants are processed.

4. The semiconductor wafer of claim 1, wherein the semiconductor wafer has a resistivity of 0.005 Ohm·cm or below.

5. The semiconductor wafer of claim 1, wherein the semiconductor wafer has a resistivity of 0.002 Ohm·cm or below.

6. The semiconductor wafer of claim 1, further comprising a structure formed by electronic components.

7. The wafer of claim 2, wherein the epitaxial layer has a higher resistivity then the wafer on which the epitaxial layer is deposited.

8. A semiconductor wafer having a resistivity of less than 0.005 Ohm·cm, said semiconductor comprising silicon, germanium, or a mixture of silicon and germanium, and doped throughout the wafer P and As with, each of P and As present in an amount of at least $1 \times 10^{17}$ atoms/cm$^3$.

* * * * *

UNITED STATES PATENT AND TRADEMARK OFFICE
CERTIFICATE OF CORRECTION

PATENT NO. : 7,341,787 B2  Page 1 of 1
APPLICATION NO. : 11/043574
DATED : March 11, 2008
INVENTOR(S) : Rupert Krauthbauer et al.

It is certified that error appears in the above-identified patent and that said Letters Patent is hereby corrected as shown below:

Column 4, Line 64, Claim 1:

Delete "alll" and insert -- all --.

Signed and Sealed this

Twenty-fourth Day of June, 2008

JON W. DUDAS
*Director of the United States Patent and Trademark Office*